United States Patent
Yang et al.

(10) Patent No.: US 10,510,611 B2
(45) Date of Patent: Dec. 17, 2019

(54) METHOD FOR DIRECT FORMING STRESSOR, SEMICONDUCTOR DEVICE HAVING STRESSOR, AND METHOD FOR FORMING THE SAME

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Che-Wei Yang, New Taipei (TW); Hao-Hsiung Lin, Taipei (TW); Samuel C. Pan, Hsinchu (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/502,917

(22) Filed: Jul. 3, 2019

(65) Prior Publication Data
US 2019/0326178 A1 Oct. 24, 2019

Related U.S. Application Data

(62) Division of application No. 15/725,174, filed on Oct. 4, 2017, now Pat. No. 10,347,538.
(Continued)

(51) Int. Cl.
*H01L 21/8234* (2006.01)
*H01L 29/10* (2006.01)
(Continued)

(52) U.S. Cl.
CPC ........... *H01L 21/823431* (2013.01); *H01L 21/26506* (2013.01); *H01L 29/1054* (2013.01); *H01L 29/41791* (2013.01); *H01L 29/66795* (2013.01); *H01L 29/785* (2013.01); *H01L 29/7842* (2013.01); *H01L 29/7849* (2013.01); *H01L 21/26513* (2013.01)

(58) Field of Classification Search
CPC ............ H01L 29/7849; H01L 29/1054; H01L 29/7842
See application file for complete search history.

(56) References Cited

U.S. PATENT DOCUMENTS 5,364,800 A 11/1994 Joyner
6,362,082 B1 3/2002 Doyle et al.
(Continued)

OTHER PUBLICATIONS

Non-Final Office Action issued in related U.S. Appl. No. 15/725,174, dated Sep. 27, 2018.
(Continued)

*Primary Examiner* — Charles D Garber
*Assistant Examiner* — Alia Sabur
(74) *Attorney, Agent, or Firm* — McDermott Will & Emery LLP

(57) ABSTRACT

A semiconductor device includes a semiconductor fin protruding from a substrate, a gate electrode over the semiconductor fin, a gate insulating layer between the semiconductor fin and the gate electrode, source and drain regions disposed on opposite sides of the semiconductor fin, a first stressor formed in a region between the source and drain regions. The first stressor is a grading strained stressor including multiple graded portions formed at graded depths. The first stressor is configured to create one of a graded compressive stress or a graded tensile stress.

20 Claims, 16 Drawing Sheets

Related U.S. Application Data

(60) Provisional application No. 62/527,839, filed on Jun. 30, 2017.

(51) Int. Cl.
 *H01L 29/78* (2006.01)
 *H01L 29/417* (2006.01)
 *H01L 29/66* (2006.01)
 *H01L 21/265* (2006.01)

(56) References Cited

U.S. PATENT DOCUMENTS

| | | |
|---|---|---|
| 7,282,414 B2 | 10/2007 | Lee et al. |
| 2003/0111699 A1 | 6/2003 | Wasshuber et al. |
| 2008/0042211 A1 | 2/2008 | Bhattacharyya et al. |
| 2009/0085110 A1 | 4/2009 | Giles et al. |
| 2011/0281409 A1 | 11/2011 | Ellis-Monaghan et al. |
| 2012/0313168 A1 | 12/2012 | Cheng et al. |
| 2014/0231872 A1 | 8/2014 | Colinge et al. |

OTHER PUBLICATIONS

Final Office Action issued in related U.S. Appl. No. 15/725,174, dated Feb. 6, 2019.

Notice of Allowance issued in related U.S. Appl. No. 15/725,174, dated May 1, 2019.

| Parameter | Range |
|---|---|
| W | 1nm to $10^5$ nm |
| H | 1nm to $10^5$ nm |
| L | 1nm to $10^5$ nm |
| L/W | $10^{-5}$ to $10^5$ |
| L/H | $10^{-5}$ to $10^5$ |
| W/H | $10^{-5}$ to $10^5$ |

METHOD FOR DIRECT FORMING STRESSOR, SEMICONDUCTOR DEVICE HAVING STRESSOR, AND METHOD FOR FORMING THE SAME

CROSS-REFERENCE TO RELATED APPLICATIONS

This application claims priority to U.S. patent application Ser. No. 15/725,174 filed Oct. 4, 2017, which claims priority of U.S. Provisional Application No. 62/527,839 filed on Jun. 30, 2017, the entire disclosure of the two applications are incorporated herein by reference.

TECHNICAL FIELD

The present disclosure relates generally to a method for forming a stressor, a semiconductor having a stressor, and a method for forming the same, and more particularly, to a method for direct forming a nano-stressor by an ion beam using a sacrificial layer, a semiconductor having a nano-stressor formed by an ion beam, and a method for forming the same.

BACKGROUND

In semiconductor devices, strain engineering has been applied to improve electron/hole mobility.

A contemporary method for forming stressors inside a semiconductor material usually requires an ion implantation mask, which further requires a photolithography process, so as to control lateral locations of stressors to be formed. In such a method, individual, independent control of the stressors including the relative locations, depths, sizes, and doped concentrations thereof are not available, because the stressors are formed simultaneously by the same implantation. Control of the depth of the stressor from the surface (e.g., a top surface of the substrate) is currently performed by changing accelerating voltage of the ion beam used to form the strainer. The problem with changing accelerating voltage of the ion beam is that the throughput can be delayed because of the machine stabilization time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
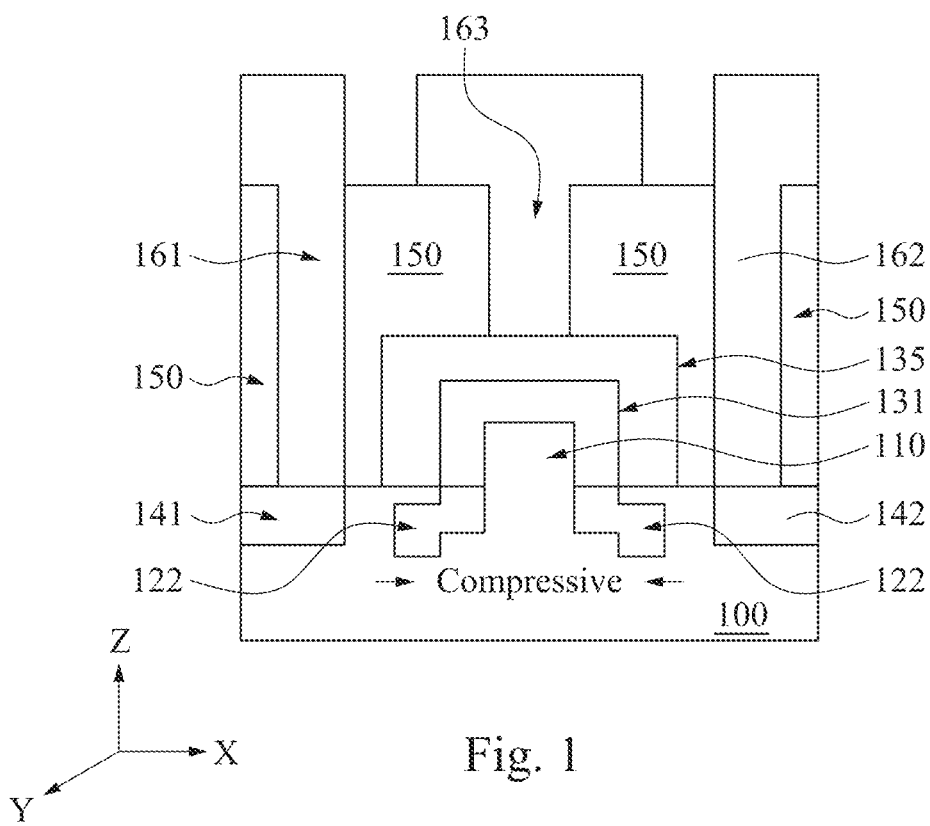
FIG. 1 is a schematic cross-sectional view of a strained channel transistor according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the entire disclosure, "about" used to describe a parameter means that design error/margin, manufacturing error/margin, measurement error etc. are considered to define the parameter. Such a description should be recognizable to one of ordinary skill in the art.

FIG. 1 is a schematic cross-sectional view of a strained channel transistor 10 according to embodiments of the present disclosure.

Referring to FIG. 1, a strained channel transistor 10 is formed in a substrate 100 which can be one of a silicon (Si) substrate, a germanium (Ge) substrate, a silicon germanium (SiGe) substrate, a gallium arsenide (GaAs) substrate, an indium gallium arsenide (InGaAs) substrate, and a silicon-on-insulator (SOI) substrate, although the present discourse is not limited thereto. The strained channel transistor 10 includes a channel region 110 made of a fin structure protruding from the substrate 100, and a gate structure including a gate insulating layer 131 and a gate electrode layer 135. The gate insulating layer 131 includes side portions covering side surfaces of the channel region 110 and includes a top surface connecting the side portions of the insulating layer 131. The gate electrode layer 135 includes side portions covering side surfaces of the gate insulating layer 131 and includes a top surface connecting the side portions of the gate electrode layer 135. The gate insulating layer 131 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The material for the gate electrode layer 135 may be poly-Si, poly-Si with silicide, Al, Cu, W, Ti, Ta, TiN, TaN, TiW, WN, TiAl, TiAlN, TaC, TaCN and TiSiN, or any other suitable materials.

In some embodiments, the channel region 110 is a portion of the substrate 100 by removing portions of the substrate 100 on opposite sides of the channel region 110 such that the remaining portion of the substrate 100 after the removal process becomes the fin structure protruding from the substrate 100. In a case in which the substrate 100 is an SOI substrate, the channel region 110 is formed of a device layer of the SOI substrate by removing portions of the device layer. Alternatively, the channel region 110 is made of an epitaxially grown semiconductor layer including, but not limited to, a crystalline silicon layer or a crystalline silicon germanium layer, on the substrate 100. In this case, one or more buffer layers (not shown) may be optionally grown on the substrate 100 prior to forming the epitaxially grown semiconductor layer so as to alleviate interface defects caused, for example, by a lattice mismatch. If necessary, portions of the epitaxially grown semiconductor layer can be removed to form the channel region 110.

Referring to FIG. 1, the strained channel transistor 10 includes source and drain regions 141 and 142 made, for example, from portions of the substrate 100 heavily doped with dopants or impurities.

The strained channel transistor 10 further includes a graded first stressor 121 which has a first portion under the gate insulating layer 13 and an extended portion at a larger depth between the source region 141 and the channel region 110. The adjective "graded" in the context of the current disclosure refers to a state of having two or more elements that are at slightly different depths and lateral positions, such as the graded first stressor 121. The first stressor 121 may not be located directly below the channel region 110 in a thickness direction of the substrate 100. In some embodiments, the first stressor 121 contains dopants or impurities that are not contained in the region immediately adjacent to the first stressor 121. For example, the first stressor 121 contains the dopants or impurities that are not contained in or the channel region 110 and/or a region immediately below the channel region 110. In some embodiments, the first stressor 121 contains dopants or impurities that may be contained in the channel region 110 and/or the source region 141 but with a much lower concentration than the concentration of the dopants or impurities contained in the first stressor 121.

According to some embodiments, the dopants or impurities contained in the first stressor 121 are one or more elements from the group consisting of helium (He), neon (Ne), and gallium (Ga), which are implanted, for example, by focused ion beam (FIB). In some embodiments, the channel region 110 and/or the source region 141 are not doped with any dopants or impurities such as He, Ne, and Ga contained in the first stressor 121.

The lattice constant of the first stressor 121 is increased, compared to the lattice constant of the same region as the first stressor 121 prior to implanting the dopants or impurities thereto. In a case in which the region corresponding to the first stressor 121, the channel region 110, and the region immediately below the channel region 110 have the same lattice constant prior to implanting the dopants or impurities, since the first stressor 121 contains the dopants or impurities that are not doped in the channel region 110, the lattice constant of the first stressor 121 is increased compared to those of the channel region 110 and the region immediately below the channel region 110.

Still referring to FIG. 1, the strained channel transistor 10 further includes a second stressor 122 disposed between the channel region 110 and the drain region 142. A description of the second stressor 122 and the drain region 142 can be referred to the above description of the first stressor 121 and the source region 141 and therefore will be omitted to avoid redundancy.

As described above, the lattice constant of the first stressor 121 and the lattice constant of the second stressor 122 are increased compared to that of a region immediately adjacent thereto, for example, the regions immediately below the channel region 110 and/or the channel region 110. That is, the lattice of the first and second stressors 121 and 122 swells, inducing stress in the transistor 10, in particular in the channel region 110. Thus, the channel region 110 undergoes a compressive stress generated by the first and second stressors 121 and 122 having a relatively greater lattice constant, and in this case, the channel region 110 is a strained channel region.

The concentration of the dopants or impurities contained in the first and second stressors 121 and 122 is from about $10^{10}/cm^3$ to about $10^{20}/cm^3$ in some embodiments, or is from about $10^{15}/cm^3$ to about $10^{20}/cm^3$ in other embodiments. In a case in which the channel region 110 is formed in an N-type well and the strained channel transistor 10 is a P-type transistor, if a range of the doped concentration from about $10^{10}/cm^3$ to about $10^{20}/cm^3$ or a range of the doped concentration from about $10^{15}/cm^3$ to about $10^{20}/cm^3$ is satisfied, a mobility of holes in the channel region 110 can be increased to allow the strained channel transistor 10 to operate in a relatively lower voltage, requiring less power, but with relatively higher current, and in the meantime, other effects that may deteriorate the performance of the transistor can be suppressed. Accordingly, such a strained channel transistor 10 can operate in a relatively higher frequency with less power compared to a transistor having the same structure as the strained channel transistor 10 except that no stressors are formed in the regions corresponding to the first and second stressors 121 and 122.

According to some embodiments, the second stressor 122, positioned at one side of the channel region 110 opposite to the first stressor 121, contains the same dopants or concentration as those contained in the first stressor 121. The doped concentrations of the first and second stressors 121 and 122 can be the same, when a variation due to manufacturing margins/errors in an implantation process is neglected. In this case, the first and second stressors 121 and 122 are positioned symmetrically in relation to the channel region 110, although the present disclosure is not limited thereto.

According to other embodiments, the second stressor 122 can be positioned at one side of the channel region 110 opposite to the first stressor 121, have dopants or impurities different from those contained in the first stressor 121, and/or have a concentration different from that of the first stressor 121. In this case, the first and second stressors 121 and 122 may be positioned unsymmetrically with respect to the channel region 110.

In some embodiments, an entire region (e.g., the first portion and the second portion) of each of the first and second stressors 121 and 122 has a uniform lattice constant. In other embodiments, the lattice constant in the first portions of the first stressor 121 or the second stressor 122 is different from the second portions. For example, the lattice constant of the second region may be smaller than the lattice constant of the first region.

In a case in which FIB is implemented to implant the dopants or impurities to form the first and second stressors 121 and 122, the first and second stressors 121 and 122 of the strained channel transistor 10 can be formed one after another, and the locations, sizes, types of dopants or impurities, and/or concentrations thereof thus can be controlled independently.

Still referring to FIG. 1, the strained channel transistor 10 further includes a source contact 161 formed over the source region 141 and electrically connected thereto, a drain contact 162 formed over the drain region 142 and electrically connected thereto, and a gate contact 163 formed over the gate electrode 135 and electrically connected thereto. The source contact 161, the drain contact 162, and the gate contact 163 each penetrate through a dielectric layer 150 over the substrate 100 and are electrically isolated from each other by the dielectric layer 150.

Although FIG. 1 shows that a configuration in which the channel region 110 made of a fin structure protrudes from the substrate 100 and the source and drain regions 141 and 142, together with the first and second stressors 121 and 122, are embedded in the substrate 100, it should be appreciated that such a configuration is an example for description and the present discourse is not limited thereto. Alternatively, the source and drain regions 141 and 142, together with the first and second stressors 121 and 122 and the channel region 110, can be modified to be formed in the same fin structure protruding from the substrate 100. It is understood that strained channel transistor 10, as shown in FIG. 1 is not necessarily a FinFET device and the shown protruded structure (e.g., fin) is intended to increase a length of the depleted channel region, According to other embodiments, the upper surface of the channel region 110 may be positioned to be flush to the other portion of the substrate 100, and in this case, the channel region 110 can be modified to not protrude from the substrate 100, similar to the source and drain regions 141 and 142 and the first and second stressors 121 and 122. However, if the device is a Fin FET device, the source and drain regions 141 and 142 are created over the fin structure on both sides of the gate structure in the Y direction, instead of the X direction shown in FIG. 1.

Figure 2:
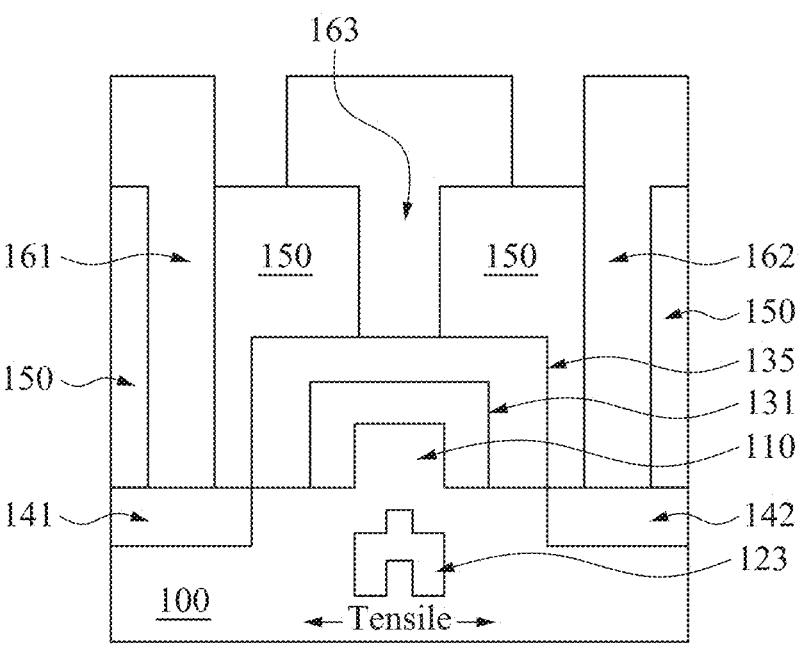
FIG. 2 is a schematic cross-sectional view of a strained channel transistor according to embodiments of the present disclosure.

FIG. 2 is a schematic cross-sectional view of a strained channel transistor 20 according to embodiments of the present disclosure.

Referring to FIG. 2, a strained channel transistor 20 according to embodiments of the present disclosure has a structure substantially the same as that of the aforementioned strained channel transistor 10 shown in FIG. 1, except that in the strained channel transistor 20, a stressor 123 is disposed below a channel region 110 and somewhat overlaps with the channel region 110 in a thickness direction of a substrate 100. The stressor 123 is a graded nano-stressor (e.g., smaller than about 10 nm) which is made using a graded sacrificial layer and without changing the accelerating voltage of the FIB, as will be discussed further below. The stressor 123 includes a top structure that approximately matches the fin structure of the channel region 110. The geometric structure of the stressor 123 in not limited to the structure shown in FIG. 2 and can have other geometric shapes, in some embodiments. In addition, in a case in which the strained channel transistor 10 is one type of a P-type transistor and an N-type transistor, the strained channel transistor 20 is configured to be the other type. One of ordinary skill in the art would recognize that the strained channel transistors 10 and 20 can be integrated into a same chip.

It should be appreciated that the aforementioned modifications to the strained channel transistor 10 are also applicable to the strained channel transistor 20 shown in FIG. 2. A description of those elements having the same reference numbers as those in FIG. 1 can be referred to the above description with reference to FIG. 1 and therefore will be omitted to avoid redundancy.

As shown in FIG. 2, the strained channel transistor 20 only includes the single contiguously formed stressor 123. Description of the types of dopants or impurities for forming the stressor 123, ranges of the dopants or impurities, and a process for forming the stressor 123 can be referred to the description of the first stressor 121 and/or the second stressor 122 with reference to FIG. 1, and will be omitted here. It is understood that strained channel transistor 20, as shown in FIG. 2 is not a necessarily FinFET device and the shown protruded structure (e.g., fin) is intended to increase a length of the depleted channel region, According to some embodiments, the upper surface of the channel region 110 may be positioned to be flush to the other portion of the substrate 100, and in this case, the channel region 110 can be modified to not protrude from the substrate 100, similar to the source and drain regions 141 and 142 and the first and second stressors 121 and 122. However, if the device is a Fin FET device, the source and drain regions 141 and 142 are created over the fin structure on both sides of the gate structure in the Y direction, instead of the X direction shown in FIG. 2.

The lattice constant of the stressor 123 is increased compared to that of the channel region 110 and compared to the same region as the stressor 123 prior to the implantation. That is, the lattice of the stressor swells, inducing stress in the transistor 20, in particular in the region immediately adjacent thereto including the channel region 110. The channel region 110 therefore undergoes a tensile stress generated by the stressor 123. The stressor 123 has a relatively greater lattice constant than the region immediately adjacent thereto including the channel region 110, and thus, the channel region 110 is a strained channel region.

In a case in which the channel region 110 is formed in a P-type well and the strained channel transistor 20 is an N-type transistor, if the aforementioned ranges of doped concentration are satisfied, in particularly the range from about $10^{15}/cm^3$ to about $10^{20}/cm^3$ is satisfied, a mobility of electrons in the channel region 110 can be increased to allow the strained channel transistor 20 to operate in a relatively lower voltage, requiring less power, but with relatively higher current, while other effects that may deteriorate the performance of the transistor can be suppressed. Such a strained channel transistor 20 can operate in a relatively higher frequency with less power compared to a transistor having the same structure as the strained channel transistor 20 except that no stressor is formed.

Although not shown, in a case in which two or more strained channel transistors 20 are formed in a same chip made from the substrate 100, when FIB is implemented to implant the dopants or impurities to form the two or more strained channel transistors 20, the stressors 123 of the two or more strained channel transistors 20 can be formed one after another, and the locations and sizes of the stressors 123 in relation to the respective channel regions, types of dopants or impurities, and/or concentrations thereof can be controlled independently according to design particulars.

A method for implanting dopants or impurities into a region of interest, for example, a region corresponding to either the first stressor 121 or the second stressor 122 shown in FIG. 1 or the stressor 123 shown in FIG. 2, in a substrate, will be described with reference to FIGS. 3A to 3C.

Figure 3A:
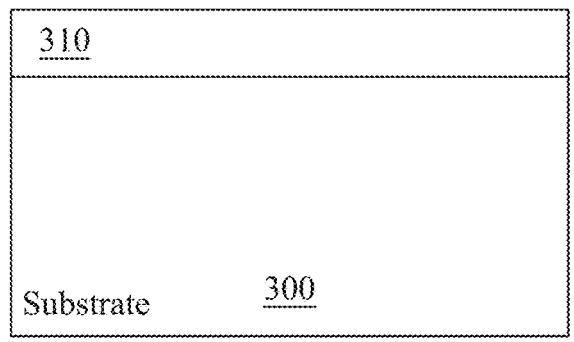
FIG. 3A is conceptual view of implanting dopants or impurities at desired depths into a region of interest in a substrate according to embodiments of the present disclosure.
Figure 3B:
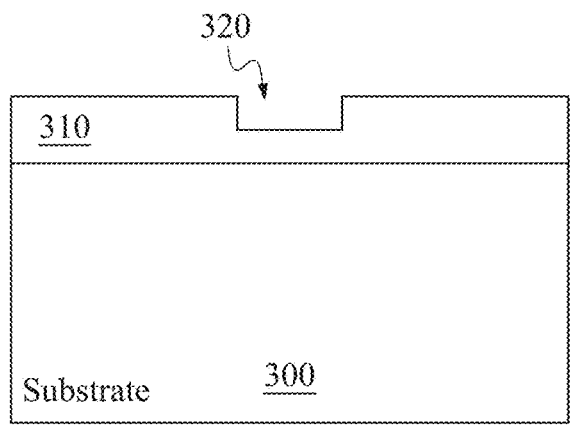
FIG. 3B is conceptual view of implanting dopants or impurities at desired depths into a region of interest in a substrate according to embodiments of the present disclosure.

FIGS. 3A to 3B are conceptual views of implanting dopants or impurities at desired depths into a region of interest in a substrate according to embodiments of the present disclosure. The doped regions can be made at different depths by using ion implantation, without changing an accelerating voltage of the FIB, by employing a graded sacrificial layer.

Referring to FIG. 3A, a sacrificial layer 310 is deposited over a substrate 300. The semiconductor substrate 300 can be, for example, a silicon (Si) substrate, a germanium (Ge) substrate, a silicon germanium (SiGe) substrate, a gallium arsenide (GaAs) substrate, an indium gallium arsenide (InGaAs) substrate, or a silicon-on-insulator (SOI) substrate. The semiconductor substrate 300 can be any other substrates that are suitable to manufacture semiconductor devices. The sacrificial layer 310 can be a silicon oxide ($SiO_x$) or a silicon nitride ($SiN_y$) material or any material that can be readily fabricated from Silicon, in some embodiments. The sacrificial layer 310 may be formed using any suitable deposition method such as chemical vapor deposition (CVD), physical vapor deposition (PVD), atomic layer deposition ALD, or other deposition methods.

Referring to FIG. 3B, the sacrificial layer 310 is patterned using known methods, such as by a photolithography process followed by dry etching process or a wet etching process, to create a recessed region 320 therein. In some embodiments, the thickness of the sacrificial layer 310 including the recessed region 320 may be within a range of about 1 nm to 1000 nm. In some embodiments, the depth of the recessed region 320 may be within a range of 5% to 95% of the thickness of the sacrificial layer 310. In some embodiments, multiple recessed regions with different depth and at desired position along the X direction in the sacrificial layer 310 can be formed to allow creation of multiple graded stressors at various depths with respect to the top surface of the substrate 300. The recessed regions facilitate formation of the stressor at various depths as discussed below.

Figure 3C:
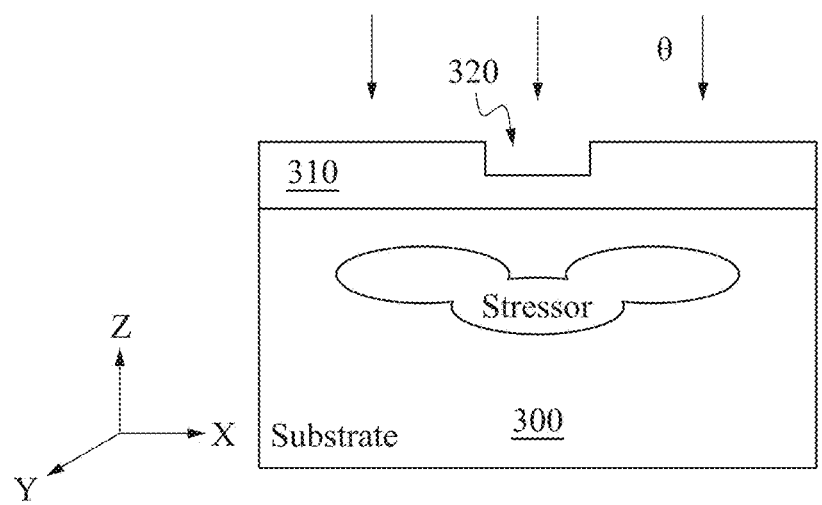
FIG. 3C is conceptual view of implanting dopants or impurities at desired depths into a region of interest in a substrate according to embodiments of the present disclosure.

Referring to FIG. 3C, an ion beam is directly applied to form a graded stressor which can be in a nano-scale in the semiconductor substrate 300. The stressor, as shown in FIG. 3C may have multiple (e.g., three) regions with different depth with respect to a top surface of the substrate 300. The depth of different regions of the stressor depends on the thickness of the sacrificial layer 310 above that region. The thinner the graded sacrificial layer over a region of the substrate 300, the deeper the formation of the stressor in that region. The depth of the stressor from the surface in the substrate may be changed by varying the accelerating voltage of the ion beam used to form the strainer or by varying the thickness of sacrificial layer, as disclosed herein. The problem with changing accelerating voltage of the ion beam is that the throughput can be delayed because of the machine stabilization time. That is because, after each change in the accelerating voltage of the ion beam, the process has to go through a pause for the machine to stabilize. The subject technology allows using the graded sacrificial layer to achieve depositing different portion of a stressor at different depth from the surface of the substrate. The stressor is formed by implantation via an ion beam that can be used to adjust the lattice constants of adjacent regions.

In some embodiments, the stressor formed, for example by an ion beam, can be shrunk to sub 10-nanometer. In this manner, the stressor is a nano-stressor. The lateral location of the stressor can be precisely controlled and formed directly due to an extremely small size of an ion beam. In some embodiments, as shown in FIG. 3C, no ion implantation mask is required to form stressors by an ion beam. The direct writing of a stressor, for example, by an ion beam instead of other fabrication processes including photography, can be relatively easier to manufacture a stressor at a desired location with a desired doped concentration at a relatively lower manufacturing cost. In other embodiments, ion implantation mask can be formed to determine lateral locations of the stressors. In those cases, the mask layer can be deposited and patterned prior to formation of the sacrificial layer 310.

In some embodiments, ions, such as He, Ne, and Ga, are implanted to a specific region by an ion beam to form a stressor. In other embodiments, boron (B) or phosphorus (P) beam, rather than He, Ne, or Ga beam, can be used for directly forming a stressor. In some embodiments, the ion beam is a focused ion beam (FIB).

A thermal annealing process can be performed after ion writing (or direct ion implantation) and thus, damage and defects caused by ion implantation can be annihilated. The thermal annealing process can be a rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The duration of thermal annealing is from about 1 second to about 24 hours in some embodiments.

The stressor is a region, a lattice of which swells by ion implantation followed by an optional annealing process. Ion beam writing/lithography can not only control the size of ion beam, but also the dosage of ions so as to adjust the amount of stress to the adjacent regions. The dosage, size, shape, depth, location, etc. of the stressor can be controlled, for example, by an acceleration voltage of ions, current of ions, an incident angle of ions, etc. In some embodiments, the acceleration voltage of ions can be about 0.1 KeV to about 1000 KeV. In other embodiments, the acceleration voltage of ions is about 1 KeV to about 50 KeV. In some embodiments, the current of ions is from about 1 fA to about 1 mA. In other embodiments, the current of ions is from about 1 pA to about 1 μA. In some embodiments, the incident angle of ions, an angle θ between incident ion current and a normal of the substrate, is from about 0.01° to about 179.99°. In other embodiments, the incident angle θ of ion current is from about 45° to about 135°. In the embodiments of FIG. 3C, control of the depth of different regions of the stressor with respect to the surface of the substrate 300 is archived by using the graded sacrificial layer 310, instead of changing accelerating voltage of the ion beams. The thicker portions of the sacrificial layer 310 further reduce the stopping range of the implantation ions within the substrate. In some embodiments, the graded sacrificial layer 310 can have other recessed regions with different depths when forming of multiple stressors at various depth of the substrate are desired.

In some embodiments, the sacrificial layer 310 includes two or more layer made of different materials. For example, the sacrificial layer 310 includes a first layer and a second layer disposed on the first layer, and the second layer is patterned to have the recessed region 320. By adjusting the thickness of the first and second layers, it is possible to control the profile of the stressor.

Figure 4:
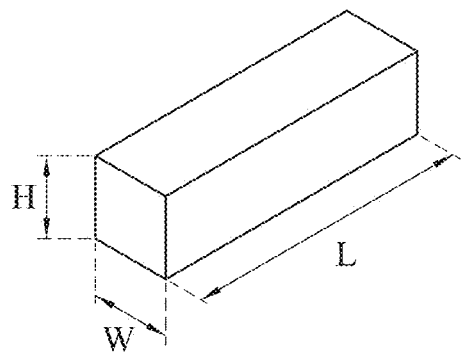
FIG. 4 is a structure of a stressor manufactured by a method according to embodiments of the present disclosure and dimensions of the exemplary structure.

Referring to FIG. 4, which shows an exemplary structure of a stressor manufactured by a method according to embodiments of the present disclosure and dimensions of the exemplary structure, a shape of a stressor can be a rectangular cuboid. Each of a width W, a length L, and a height H of the rectangular cuboid ranges from about 1 nm to about $10^5$ nm and a ratio between two of the width W, length L, and height H ranges from about $10^{-5}$ to about $10^5$, although the present disclosure is not limited thereto.

A rectangular-cuboid-shaped stressor shown in FIG. 4 is merely an example; the stressor according to embodiments of the present disclosure, however, can have other shapes including, but not limited to, a cubic shape, an ovoid shape, a tetrahedron shape, a hexagonal prism, etc. In some embodiments, any other shape can be obtained by direct writing via ion beam. In some embodiments, different stressor regions with different shapes and dimensions can also be created without changing the accelerating voltage of the implantation ions.

FIGS. 5A to 5J are process stages illustrating a process flow for manufacturing the strained channel transistor shown in FIG. 1, according to embodiments of the present disclosure.

Figure 5A:
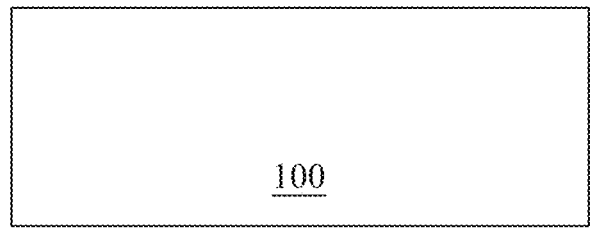
FIG. 5A is a process stage illustrating a process flow for manufacturing the strained channel transistor shown in FIG. 1, according to embodiments of the present disclosure.

Referring to FIG. 5A, a substrate 100, which can be one of a silicon (Si) substrate, a germanium (Ge) substrate, a silicon germanium (SiGe) substrate, a gallium arsenide (GaAs) substrate, an indium gallium arsenide (InGaAs) substrate, a silicon-on-insulator (SOI) substrate, and any other semiconductor substrate, is prepared.

Figure 5B:
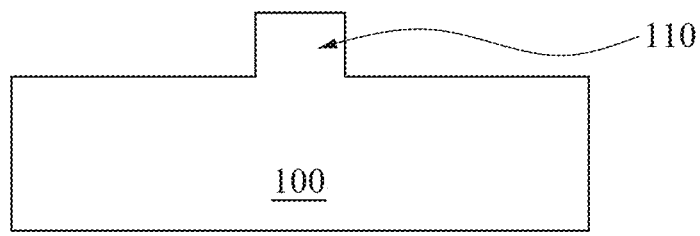
FIG. 5B is a process stage illustrating a process flow for manufacturing the strained channel transistor shown in FIG. 1, according to embodiments of the present disclosure.

As shown in FIG. 5B, a fin structure, a portion of which becomes a channel region 110, is formed on the substrate 100 such that the fin structure protrudes from the substrate 100. The fin structure can be formed, for example, by a portion of the substrate 100 when portions of the substrate 100 on opposite sides of the fin structure are removed by a photolithography process followed by a dry etching process or a wet etching process. Thus, the remained top portion of the substrate 100 becomes the fin structure.

In a case in which the substrate 100 is an SOI substrate, the fin structure can be formed of a device layer of SOI substrate by removing portions of the device layer.

Alternatively, the channel region 110 can be formed by epitaxially growing a semiconductor layer including, but not limited to, a crystalline silicon layer or a crystalline silicon germanium layer, on the substrate 100 followed by a photolithography process and a dry etching process or a wet etching process. Accordingly, the remaining portion of the epitaxially grown layer becomes the fin structure on the substrate 100. Optionally, one or more buffer layers (not shown) may be grown on the substrate 100 prior to epitaxially growing the semiconductor layer so as to alleviate interface defects caused, for example, by lattice mismatch between the epitaxially grown semiconductor layer and the substrate 100.

Figure 5C:
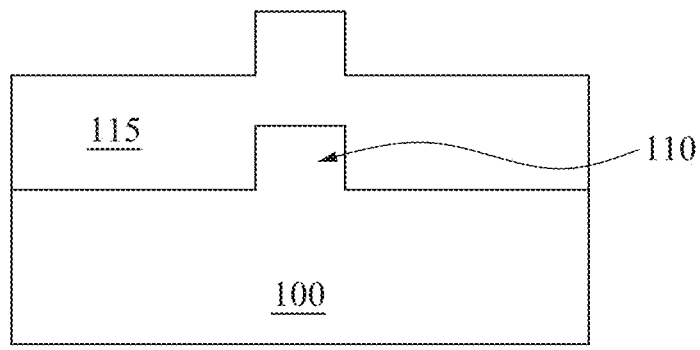
FIG. 5C is a process stage illustrating a process flow for manufacturing the strained channel transistor shown in FIG. 1, according to embodiments of the present disclosure.

Referring to FIG. 5C, a sacrificial layer 115 is formed over the substrate and the fin structure. The sacrificial layer 115 can be a silicon oxide ($SiO_x$) or a silicon nitride ($SiN_y$) material or any material that can be readily fabricated from Silicon, in some embodiments. The sacrificial layer 310 may be formed using any suitable deposition method such as chemical vapor deposition (CVD), physical vapor deposition (PVD), atomic layer deposition ALD, or other deposition methods.

Figure 5D:
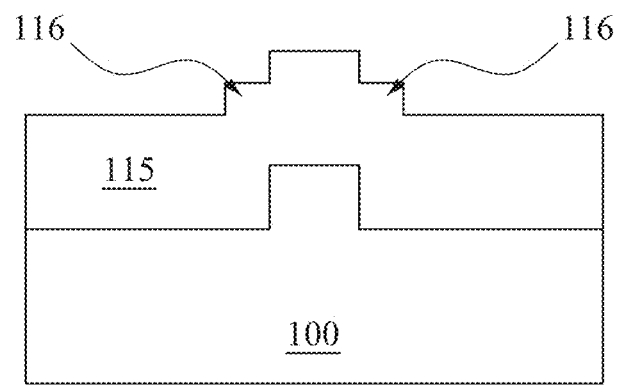
FIG. 5D is a process stage illustrating a process flow for manufacturing the strained channel transistor shown in FIG. 1, according to embodiments of the present disclosure.

Referring to FIG. 5D, the sacrificial layer 310 is patterned using known methods, such as by a photolithography process followed by dry etching process or a wet etching process, to create step regions 116 on both sides of the fin structure. In some embodiments, various thicknesses of the graded sacrificial layer including the step regions 116 may be within a range of about 0.1 nm to 1000 nm. In some embodiments, the same thicknesses can be within a range of about 5 nm to 500 nm.

Figure 5E:
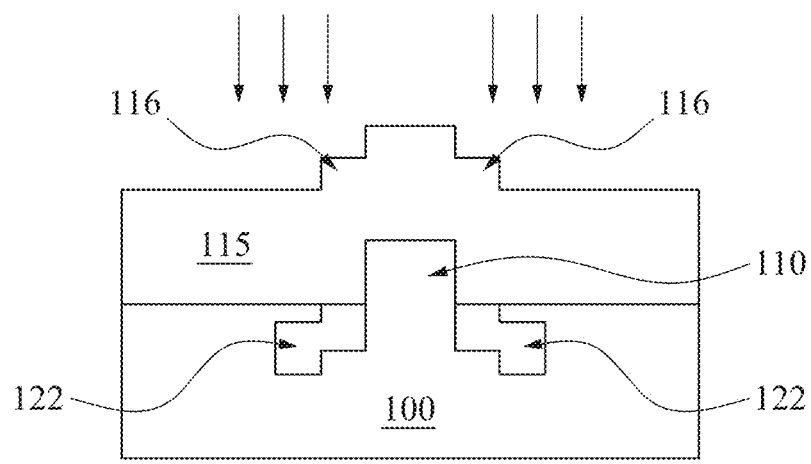
FIG. 5E is a process stage illustrating a process flow for manufacturing the strained channel transistor shown in FIG. 1, according to embodiments of the present disclosure.

Referring to FIG. 5E, first and second stressors 121 and 122 are formed by implanting one or more from the group consisting of helium (He), neon (Ne), and gallium (Ga). In some embodiments, the implantation can be via an ion beam so as to adjust lattice constants of the regions corresponding to the first and second stressors 121 and 122 in relation to the regions immediately adjacent thereto and the channel region 110. In this case, the channel region 110 undergoes a compressive stress generated by the first and second stressors 121 and 122 having a relatively greater lattice constant than that of the channel region 110. The compressive stress created by the each of the stressors 121 and 122 can be a graded compressive stress because it has values that vary by depth, the same as the stressor regions that are graded in that sense. In some embodiments, the ion beam can be a focused ion beam (FIB). In other embodiments, a boron (B) or phosphorus (P) beam, rather than a He, Ne, or Ga beam, can be used to form the first and second stressors 121 and 122.

In a case in which an ion beam or a focused ion beam is used to form the first and second stressors 121 and 122, the first and second stressors 121 and 122 can be formed one after another, i.e., not simultaneously. The size, for example, a diameter when the shape is a sphere or a side length when the shape is a cubic, of the first and second stressors can be shrunk to sub 10-nanometer, depending on design particulars. The size and the location of the first and second stressors 121 and 122 can be precisely controlled due to extremely small size of the ion beam. In some embodiments, no ion implantation mask is required to directly form the first and second stressors 121 and 122 by the ion beam. The direct writing process by the ion beam instead of other fabrication processes including photo-lithography can be easier to manufacture a stressor at a desired location with a desired doped concentration at a relatively lower manufacturing cost. The depth of different regions of the stressors 121 and 122 is controlled by the thickness of the sacrificial layer above the regions. For example, in the regions of the stressors 121 and 122 that are under the step regions 116 of the sacrificial layer, the ion beam loses more of its energy in the sacrificial layer and has a shorter stopping range in the substrate. Whereas, for the regions of the stressors 121 and 122 that are not under the step regions 116 of the sacrificial layer, the ion beam loses less of its energy in the sacrificial layer and has a longer stopping range in the substrate and the stressor in that region in created in a higher depth.

In other embodiments, an ion implantation mask can be optionally formed to determine lateral locations of the stressors. The ion implantation mask can be formed before deposition of the sacrificial layer 115.

The dosage, size, shape, depth, location, etc. of the first and second stressors 121 and 122 can be controlled, for example, by an acceleration voltage of ions, current of ions, an incident angle of ions, etc. In some embodiments, the acceleration voltage of ion can be about 0.1 KeV to about 1000 KeV. In other embodiments, the acceleration voltage of ions is about 1 KeV to about 50 KeV. In some embodiments, the current of ion is from about 1 fA to about 1 mA. In other embodiments, the current of ions is from about 1 pA to about 1 μA. In some embodiments, the incident angle of ions, an angle θ between incident ion current and a normal of the substrate, is from about 0.01° to about 179.99°. In other embodiments, the incident angle θ of ion current is from about 45° to about 135°. The subject technology allows using the graded sacrificial layer to achieve depositing different portion of a stressor at different depth from the surface of the substrate. In the embodiment of FIG. 5E, for example, the depth of different portion of the stressors 121 and 122 are controlled by using the graded sacrificial layer instead of varying an accelerating voltage of the ion implantation beam.

After implantation, a thermal annealing process can be optionally performed and thus, damage and defects caused by ion implantation can be annihilated. The thermal annealing process can be a rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The duration of thermal annealing is from about 1 second to about 24 hours in some embodiments.

Figure 5F:
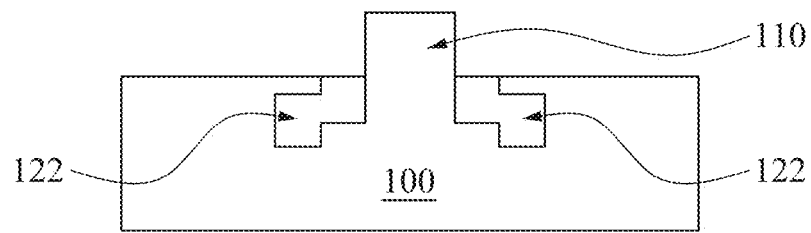
FIG. 5F is a process stage illustrating a process flow for manufacturing the strained channel transistor shown in FIG. 1, according to embodiments of the present disclosure.

Referring to FIG. 5F, the sacrificial layer 115 including the step regions 116 are removed by an etch process such as a dry etch or a wet etch process.

Figure 5G:
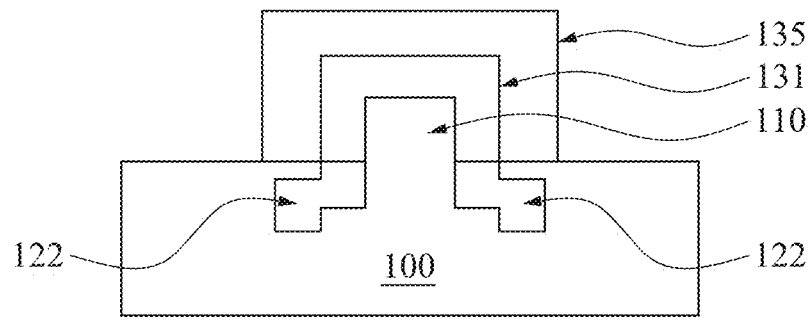
FIG. 5G is a process stage illustrating a process flow for manufacturing the strained channel transistor shown in FIG. 1, according to embodiments of the present disclosure.

Referring to FIG. 5G, a gate structure including a gate insulating layer 131 and a gate electrode 135 is formed to cover the channel region 110 including side surfaces thereof and a top surface thereof connecting the side surfaces.

Figure 5H:
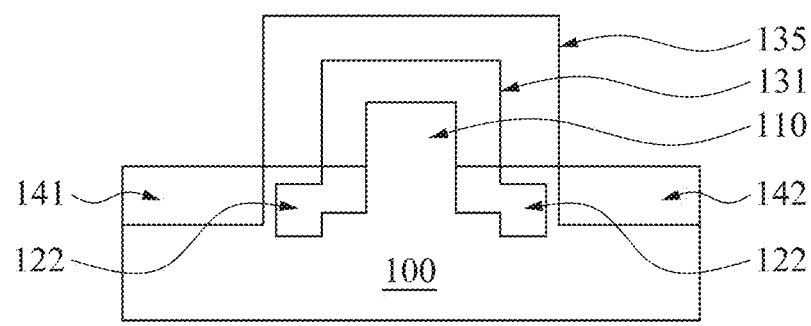
FIG. 5H is a process stage illustrating a process flow for manufacturing the strained channel transistor shown in FIG. 1, according to embodiments of the present disclosure.

Referring to FIG. 5H, source and drain regions 141 and 142 are formed by implantation, which can be another technique other than the ion beam or the focused ion beam used to form the first and second stressors 121 and 122. Before the implantation process for forming the source and drain regions 141 and 142, an implantation mask (not shown) can be formed first to define the locations of the source and drain regions 141 and 142. Ions in the process shown in FIG. 5H may be applied to the entire surface of the substrate 100 but selectively implanted in the regions, defined by the implantation mask (not shown) corresponding to the source and drain regions, to form the source and drain regions 141 and 142. In this regard, the source and drain regions 141 and 142, unlike the first and second stressors, are formed simultaneously.

Figure 5I:
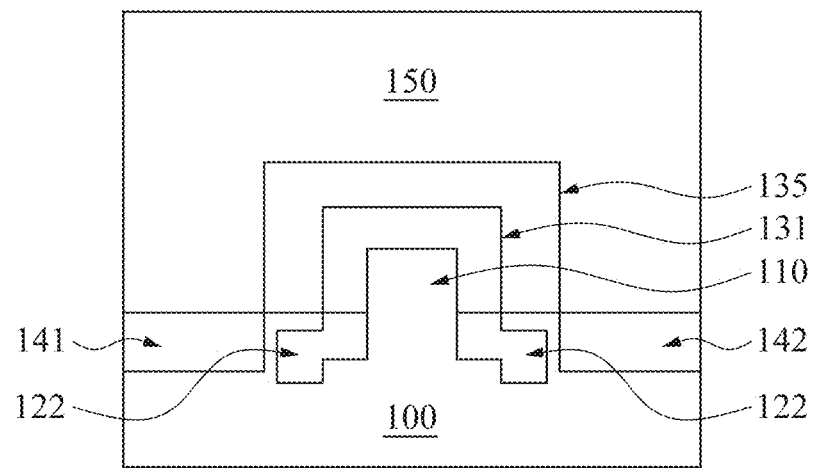
FIG. 5I is a process stage illustrating a process flow for manufacturing the strained channel transistor shown in FIG. 1, according to embodiments of the present disclosure.

Thereafter, as shown in FIG. 5I, one or more intermediate dielectric layers 150 are formed to cover the surface of the substrate 100 and the surface of the structure including the gate electrode layer 135 and the source and drain regions 141 and 142.

Figure 5J:
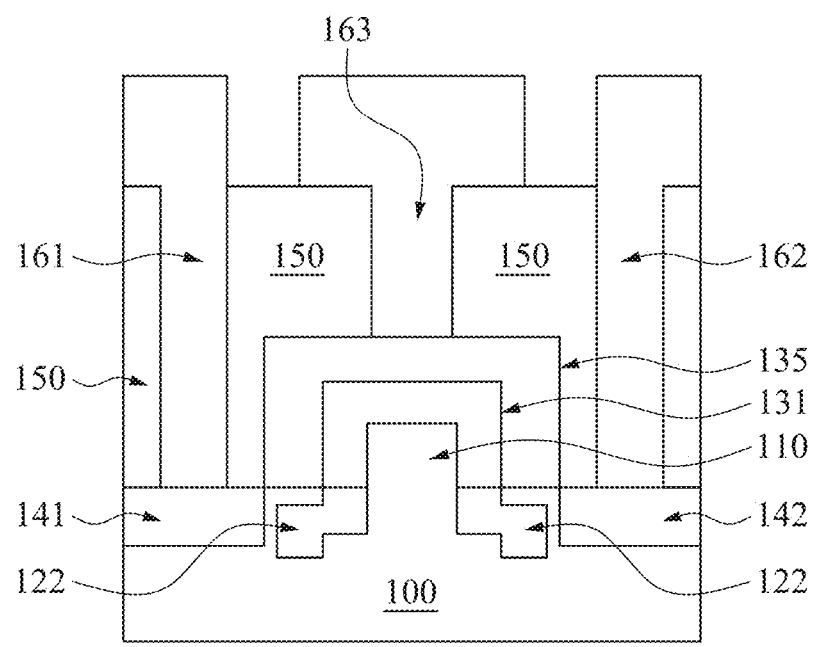
FIG. 5J is a process stage illustrating a process flow for manufacturing the strained channel transistor shown in FIG. 1, according to embodiments of the present disclosure.

Then, as shown in FIG. 5J, a source contact 161, a drain contact 162, and a gate contact 163, each penetrating through the one or more intermediate dielectric layers 150, are formed to electrically connect to the source region 141, the drain region 142, and the gate electrode layer 135, respectively. Accordingly, the strain channel transistor 10 shown in FIG. 1 is formed.

FIGS. 6A to 6F are process stages illustrating a process flow for manufacturing the strained channel transistor shown in FIG. 2, according to embodiments of the present disclosure.

To avoid redundancy, FIGS. 6A to 6F only shows an implantation by an ion beam or a focused ion beam to make a stressor and the remaining processes to complete a device can be referred to the description with reference to FIGS. 5G to 5J.

Figure 6A:
FIG. 6A is a process stage illustrating a process flow for manufacturing the strained channel transistor shown in FIG. 2, according to embodiments of the present disclosure.
Figure 6B:
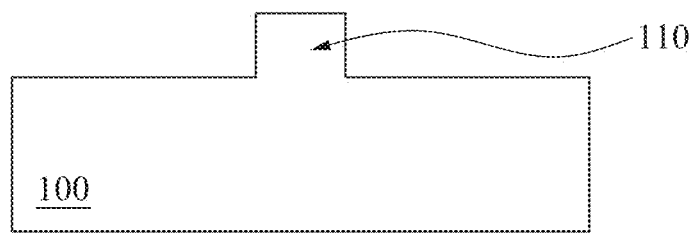
FIG. 6B is a process stage illustrating a process flow for manufacturing the strained channel transistor shown in FIG. 2, according to embodiments of the present disclosure.
Figure 6C:
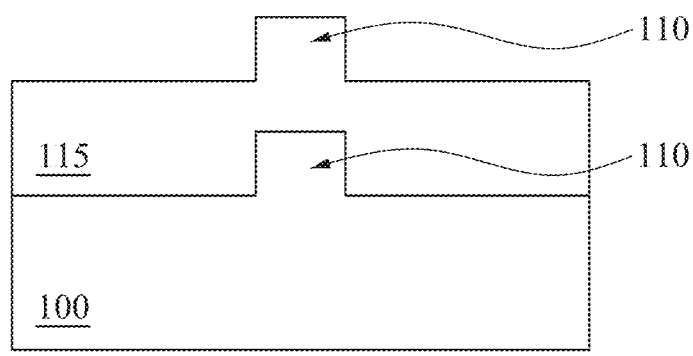
FIG. 6C is a process stage illustrating a process flow for manufacturing the strained channel transistor shown in FIG. 2, according to embodiments of the present disclosure.

Referring to FIGS. 6A to 6C, the process stages of forming the substrate 100, the fin structure for channel region 110, and the formation of the sacrificial layer 115 (FIG. 6C) are similar to the process stages shown in FIGS. 5A to 5C, and are not repeated here to prevent redundancy.

Figure 6D:
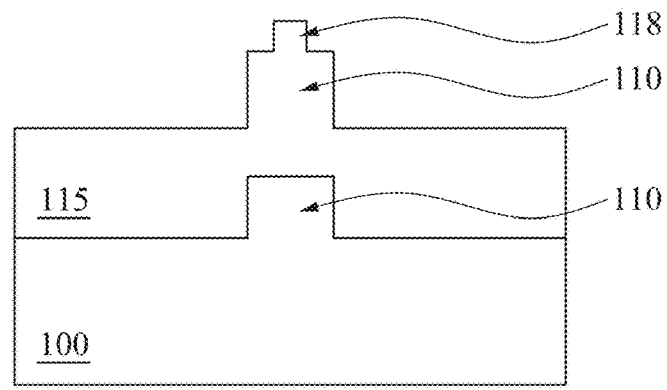
FIG. 6D is a process stage illustrating a process flow for manufacturing the strained channel transistor shown in FIG. 2, according to embodiments of the present disclosure.

Referring to FIG. 6D, the sacrificial layer 115 is patterned using photo-lithography and an etch method such as a wet etch process or a dry etch process to create a protruding structure 118 on the top portion of the sacrificial layer 115 covering the fin structure.

Figure 6E:
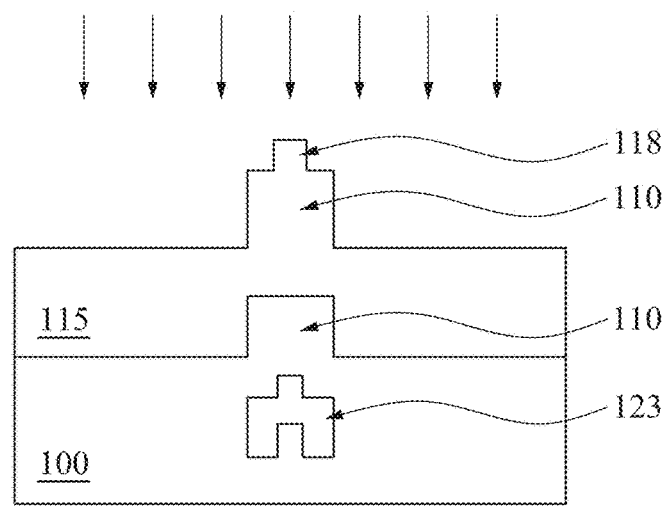
FIG. 6E is a process stage illustrating a process flow for manufacturing the strained channel transistor shown in FIG. 2, according to embodiments of the present disclosure.

Referring to FIG. 6E, a stressor 123 can be formed in a similar manner as the first and second stressors shown in FIG. 5E. The stressor 123 is a graded nano-stressor (e.g., smaller than about 10 nm) which is made using the graded sacrificial layer and without changing the accelerating voltage of the ion beam. The stressor 123 includes a top structure that approximately matches the fin structure of the channel region 110 and is created at a lower depth (from a top surface of the substrate 100) due to the protruding structure 118 that reduces the range of ions in the fin structure that is under the protruding structure 118. The geometric structure of the stressor 123 in not limited to the structure shown in FIG. 6E and can have other geometric shapes, in some embodiments. The stressor 123 has a relatively greater lattice constant than the region immediately adjacent thereto including the channel region 110. Accordingly, a channel region 110 undergoes a tensile stress generated by the stressor 123 below the channel region 110 in a thickness direction of a substrate 100. The tensile stress created by the each of the stressor 123 can be a graded tensile stress because it has values that vary by depth, the same as the stressor regions that are graded in that sense. Other description can be referred to that with reference to FIG. 5E and will be omitted to avoid redundancy.

Figure 6F:
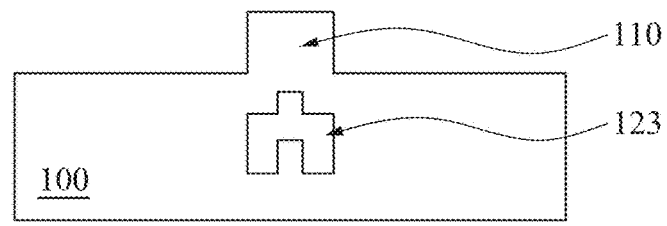
FIG. 6F is a process stage illustrating a process flow for manufacturing the strained channel transistor shown in FIG. 2, according to embodiments of the present disclosure.

Referring to FIG. 6F, the sacrificial layer including the protruding structure 118 are removed using an etch process such as a wet etch or a dry etch process.

By the processes shown in FIGS. 6A to 6F, together with those shown in FIGS. 5G to 5J, the strained channel transistor 20 shown in FIG. 2 is formed.

As described above, the process stages for manufacturing a stressor according to embodiments of the present disclosure shown in FIGS. 3A to 3C can be implemented to manufacture a semiconductor chip including strained channel transistors. The present disclosure is not limited thereto. Hereinafter, a method including the process for manufacturing a stressor will be described with reference to FIGS. 7A to 7F.

FIGS. 7A to 7F are process stages illustrating a process flow for manufacturing multiple semiconductor nanowires (NWs) according to embodiments of the present disclosure.

Figure 7A:
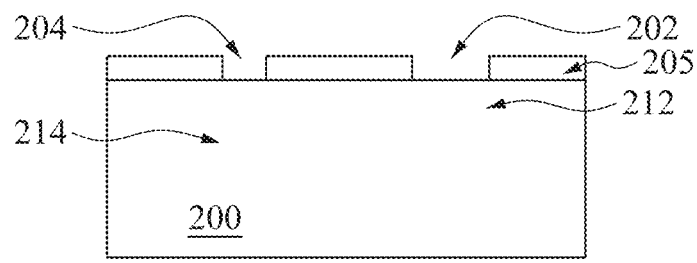
FIG. 7A is a process stage illustrating a process flow for manufacturing multiple semiconductor nanowires (NWs) according to embodiments of the present disclosure.

First, as shown in FIG. 7A, a hard masking layer 205 such as an oxide layer is formed on a semiconductor substrate 200 and patterned to form openings 202 and 204. The semiconductor substrate 200 can be a silicon (111) substrate and the hard masking layer 205 can be a silicon oxide layer formed by thermal oxidation, although the present disclosure should not limited thereto. In a case the hard masking layer 205 is a silicon oxide layer, the thickness of the silicon oxide layer can be from 10 nm to 50 nm.

Figure 7B:
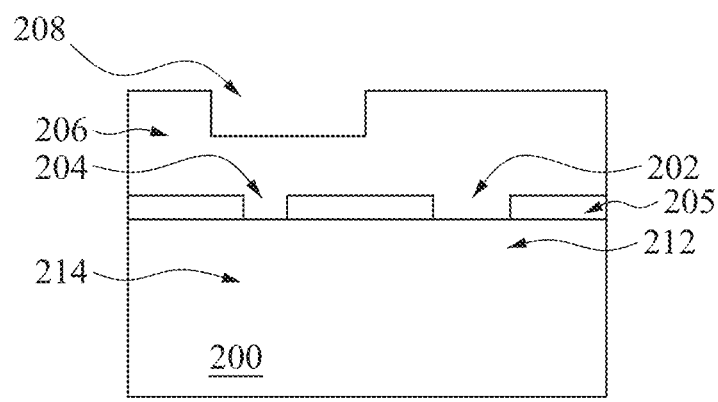
FIG. 7B is a process stage illustrating a process flow for manufacturing multiple semiconductor nanowires (NWs) according to embodiments of the present disclosure.

Referring to FIG. 7B, a sacrificial layer 206 is formed and patterned as described with respect to FIGS. 3A to 3B. The detail of the deposition and patterning process is not repeated to prevent redundancy.

Figure 7C:
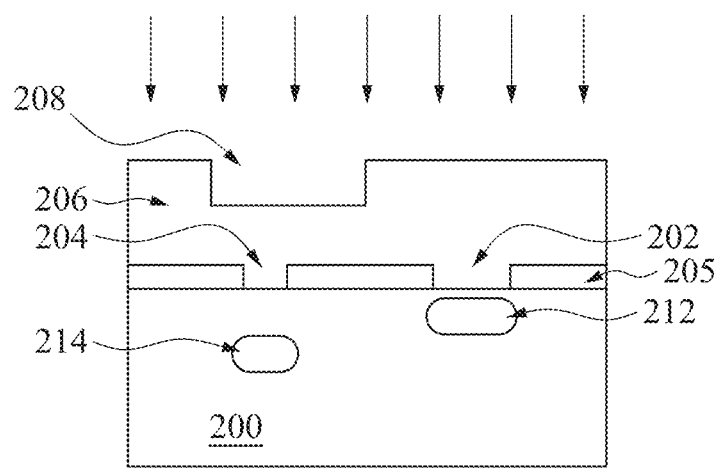
FIG. 7C is a process stage illustrating a process flow for manufacturing multiple semiconductor nanowires (NWs) according to embodiments of the present disclosure.

Referring to FIG. 7C, first and second stressors 212 and 214 are formed by implanting one or more from the group consisting of helium (He), neon (Ne), and gallium (Ga). In some embodiments, the implantation can be via an ion beam so as to adjust lattice constants of the regions corresponding to the first and second stressors 212 and 214 in relation to the regions immediately adjacent thereto. In this case, the regions immediately adjacent to the first and second stressors 212 and 214, such as below the openings 202 and 204 of the mask 205, undergoes a compressive stress generated by the first and second stressors 212 and 214 having a relatively greater lattice constants. In some embodiments, the ion beam can be a focused ion beam (FIB). In other embodiments, a boron (B) or phosphorus (P) beam, rather than a He, Ne, or Ga beam, can be used to form the first and second stressors 212 and 214.

In a case in which an ion beam or a focused ion beam is used to form the first and second stressors 212 and 214, the first and second stressors 212 and 214 can be formed one after another, i.e., not simultaneously. In some embodiments, the number of stressors is not limited to two stressors and more than two stressors with different dimensions and at different depths with respect to the top surface of the substrate can be formed. The size, for example, a diameter when the shape is a sphere or a side length when the shape is a cubic, of the first and second stressors can be shrunk to sub 10-nanometer, depending on design particulars. The size and the location of the first and second stressors 212 and 214 can be precisely controlled due to extremely small size of the ion beam.

In some embodiments, the hard masking layer 205 is not patterned prior to formation of the sacrificial layer 206. In those embodiments, the masking layer 205 can be patterned by ion beam milling/writing or focused ion beam (FIB) milling/writing. That is, ions or dopants/impurities are implanted into the semiconductor substrate 200 such that the stressors 212 and 214 are formed inside the substrate 200 where the ions or dopants/impurities settle, similar to the process shown in FIG. 5E or FIG. 6E.

An accelerating voltage of about 0.1 KeV to about 1000 KeV or about 1 KeV to about 50 KeV can be used to generate ion current. The ion beam milling can be configured to have a spot mode in which ions bombard at a single point or a circle mode in which ions bombard in an area defined by a circle. A spot size of the focused ion beam (FIB) for the spot mode and/or the circle mode is from about 0.5 nm to about 10 nm in some embodiments. The exposure dosage for the circle mode can be from 5 nC/$\mu m^2$ to 25 nC/$\mu m^2$ and the exposure dosage for the spot mode can be from 1.5 pC to 8 pC in some embodiments. The formation of the stressors 212 and 214 having, for example, a rounded cylinder or an oval-shaped ball under the openings 202 and 204 simultaneously accompanies the formation of openings 202 and 204 in the hard masking layer 205. In some embodiments, ions are selected from the group consisting of He, Ne, and Ga.

Figure 7D:
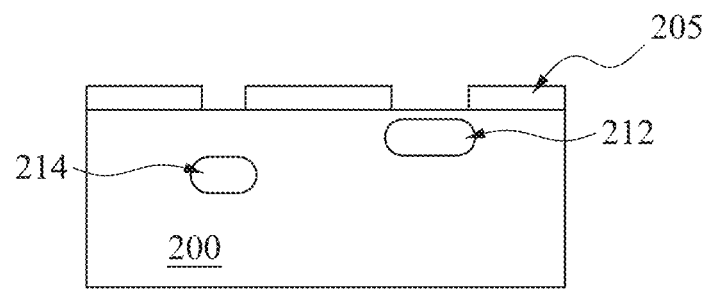
FIG. 7D is a process stage illustrating a process flow for manufacturing multiple semiconductor nanowires (NWs) according to embodiments of the present disclosure.

Optionally, a thermal annealing process can be performed after ion writing, damage and defects caused by ion implantation can be annihilated. The thermal annealing process can be a rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The duration of thermal annealing is from about 1 second to about 24 hours in some embodiments. In some embodiments, the thermal annealing can be performed after the sacrificial layer 206 is removed, as seen in FIG. 7D. The removal of the sacrificial layer can be done using a wet or dry etch process.

To ensure effective growth of semiconductor nanowires, a surface treatment process, such as a dry etching or a wet etching, to remove the residue of the hard masking layer material in the region bombarded by the ion beam, can be optionally performed with reference to FIG. 7D. In a case in which the hard masking layer 205 is a silicon oxide layer formed by thermal oxidizing the substrate 200 formed of silicon, the residue of silicon oxide in the portion bombarded by the ion beam can be removed by dipping in a dilute HF solution.

Figure 7E:
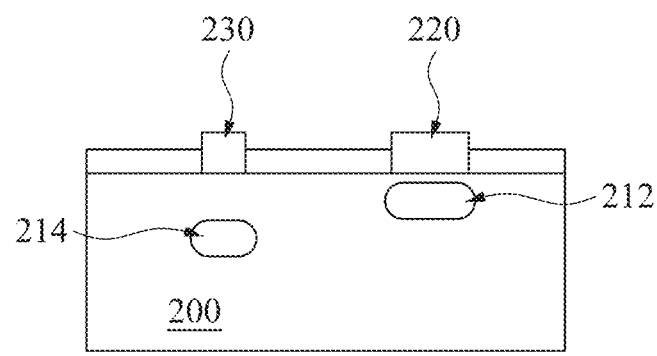
FIG. 7E is a process stage illustrating a process flow for manufacturing multiple semiconductor nanowires (NWs) according to embodiments of the present disclosure.

Referring to FIG. 7E, semiconductor nanowires 220 and 230 are grown from the exposed portion of the substrate 200 by, for example, molecular beam epitaxy (MBE), although the present disclosure is not limited thereto. In a case in which the substrate 200 is a silicon (111) substrate, the hard masking layer 205 is a silicon oxide layer, and He ions are implanted by a focused ion beam to form the stressor 210 in the substrate 200, an InAs nanowire can be grown from the exposed portion of the substrate 200. In a case the silicon oxide layer is completely removed at the region bombarded, by the He ion beam and/or a dipping process in the diluted HF solution, the InAs nanowire can be directly formed on the exposed silicon substrate 200. Indium beam and $As_2$ beam for forming the InAs nanowire can come from effusion cells. The growth temperature can be from 400° C. to 600° C. In other embodiments, GaAs nanowires can be formed in a similar manner as the InAs nanowires. The range of the growth temperature of the GaAs nanowires can be from about 400° C. to about 700° C. in some embodiments.

Figure 7F:
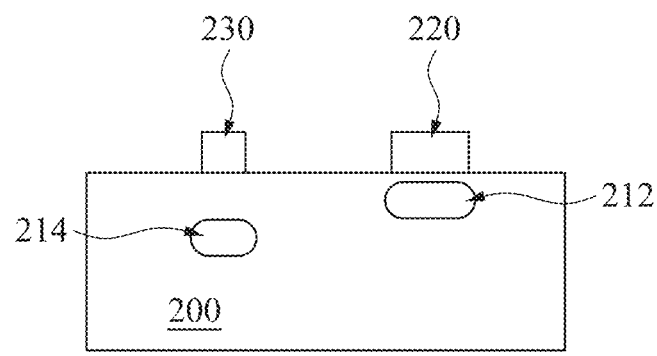
FIG. 7F is a process stage illustrating a process flow for manufacturing multiple semiconductor nanowires (NWs) according to embodiments of the present disclosure.

Referring to FIG. 7F, the masking layer 205 is removed using, for example, a dry etch process.

Figure 8A:
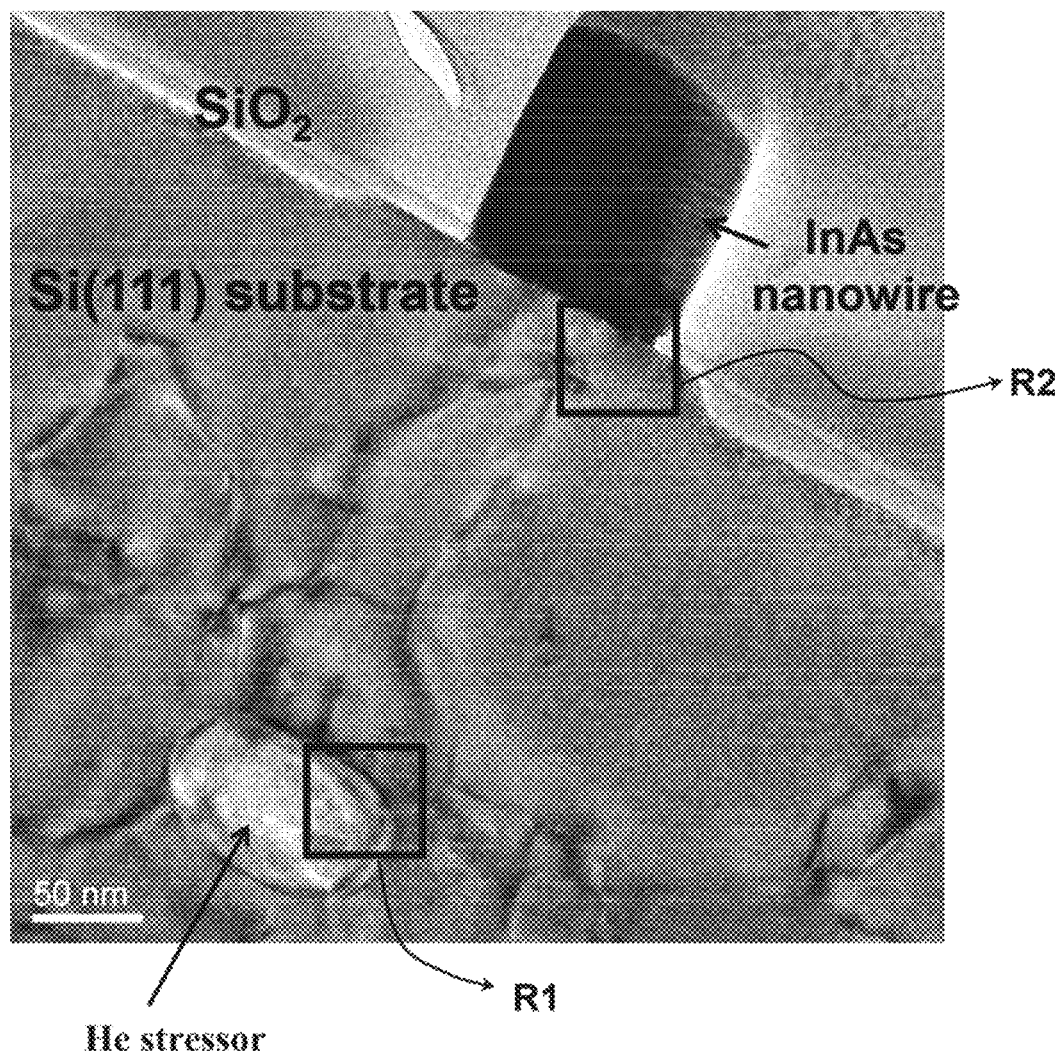
FIG. 8A is a transmission electron microscopy (TEM) image of an InAs nanowire formed on a silicon (111) substrate having a helium stressor embedded therein.
Figure 8B:
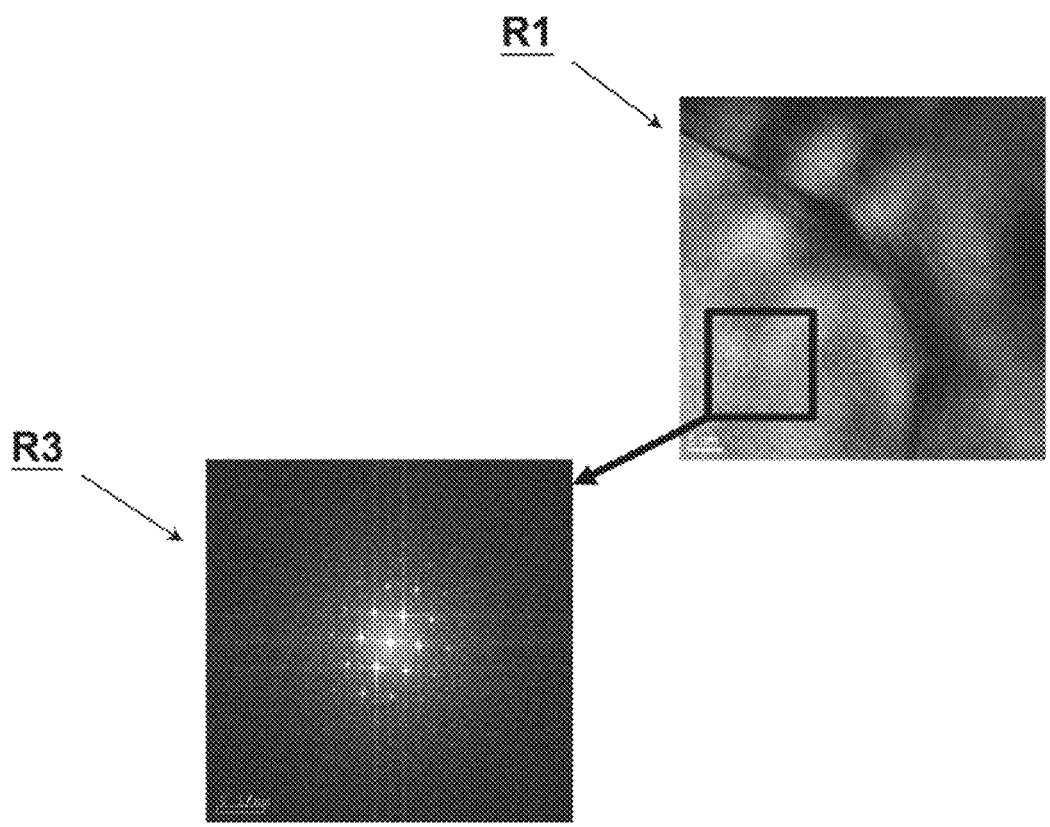
FIG. 8B is a transmission electron microscopy (TEM) image and a diffraction image of region R1 of FIG. 8A.
Figure 8C:
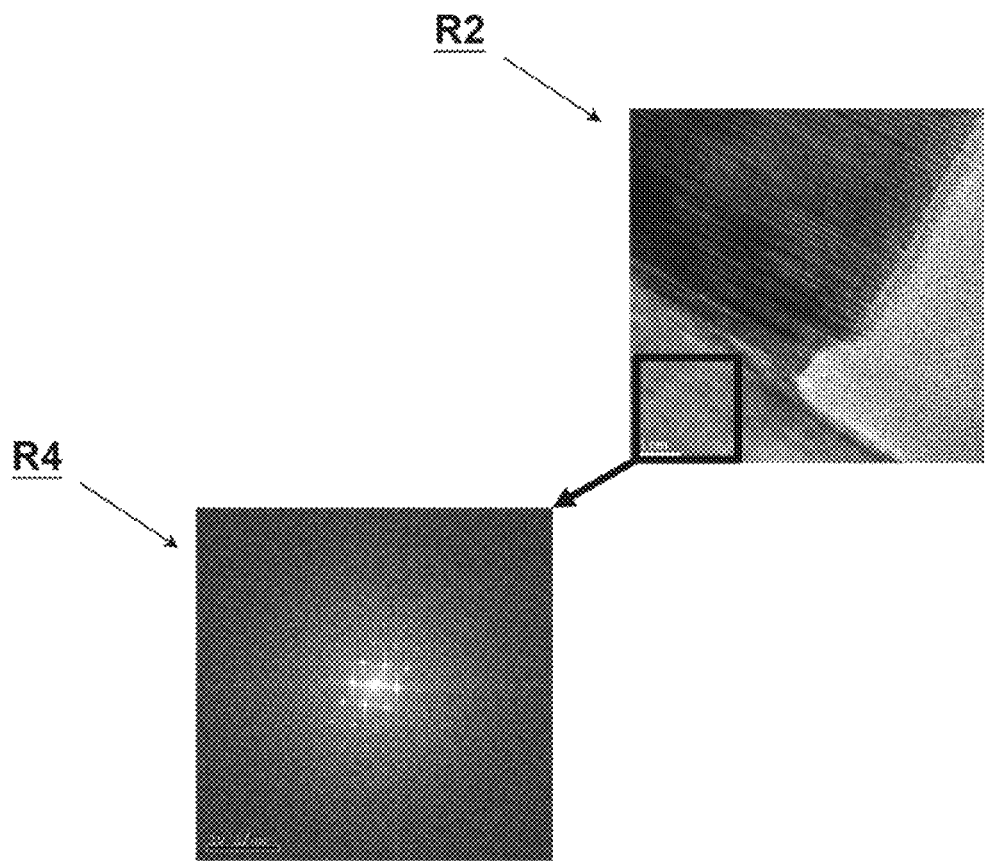
FIG. 8C is a transmission electron microscopy (TEM) image and a diffraction image of region R2 of FIG. 8A.

Due to the stressors 212 and 214 in the substrate 200, the lattice constant in the region of the stressors 212 and 214 increases, causing the lattice constant of the region adjacent thereto to increase slightly, as evidenced by FIGS. 8A to 8C which show transmission electron microscopy (TEM) images of an InAs nanowire formed on a silicon (111) substrate having a He stressor therein. FIG. 8B shows the image R1 of a region of the stressor and a corresponding higher resolution image R3. The TEM image shows a stressor with a swelled lattice constant of about 5.546 Å, which is higher than a lattice constant of about 5.431 Å of silicon. Since the lattice mismatch at an interface between the silicon substrate and the InAs nanowire grown thereon can be reduced by forming the He stressor in the silicon substrate, formation of the vertically grown InAs nanowire can be promoted and a yield can be improved. FIG. 8C shows an image of the interface region R2 and a corresponding higher resolution image R4 that shows a lattice constant of about 5.517 Å, which is higher than the lattice constant of silicon, due to the formation of the stressor.

According to some aspects of the present disclosure, ion beam or focused ion beam, selected from the group consisting of He, Ne, and Ga, can be directly and precisely applied to a substrate to form a stressor therein. No implantation mask may be required to form the stressor. Lattice constants in the region of the stressor and the region adjacent to the stressor can be modulated depending on the size, location, and doped concentration of the stressor. The subject technology uses a graded sacrificial layer to control the depths of various portions of the stressors in the substrate, instead of changing an accelerating voltage of the beam, to prevent delayed throughput that can be caused by changing an accelerating voltage of the beam.

According to some aspects of the present disclosure, in a case in which one or more stressors are implemented into a transistor, a channel region of the transistor can be biased by either a compressive stress or a tensile stress, and accordingly, electron mobility or hole mobility can be improved. The transistor can thus operate at a relatively high frequency with relatively lower power consumption. According to some aspects of the present disclosure, a semiconductor device includes a semiconductor fin protruding from a substrate. The semiconductor device further includes a gate electrode disposed over the semiconductor fin. A gate insulating layer is disposed between the semiconductor fin and the gate electrode. Source and drain regions are disposed on opposite sides of the semiconductor fin, and a first stressor is formed in a region of the substrate between the source and drain regions or in a region of the semiconductor fin between the source and drain regions. The first stressor is a grading strained stressor including multiple graded portions formed at graded depths, and the first stressor is configured to create one of a graded compressive stress or a graded tensile stress.

According to some aspects of the present disclosure, a method for manufacturing a semiconductor device includes forming a semiconductor fin on a substrate. The method further includes depositing and patterning a graded sacrificial layer over the substrate. a first stressor is implanted in the substrate by using an ion beam through the graded sacrificial layer. The graded sacrificial layer is then removed. A gate insulating layer is deposited and patterned to cover the semiconductor fi. A gate electrode layer is formed to cover the gate insulating layer. Source and drain electrodes are formed on opposite sides of the semiconductor fin.

According to some aspects of the present disclosure, a method for forming multiple nanowires on a semiconductor substrate includes forming a patterned mask layer including multiple trenches over the semiconductor substrate. The method further includes forming a graded sacrificial layer over the mask layer including the multiple trenches. Ion current is applied on a region of the graded sacrificial layer including the multiple openings, such that ions of the ion current bombard the region of graded sacrificial layer to settle at different depths in regions in the semiconductor substrate to form multiple stressors at the different depths. The multiple nanowires are grown on portions of the semiconductor substrate exposed by the multiple openings of the patterned mask layer.

In accordance with one aspect of the present disclosure, a semiconductor device includes a semiconductor fin protruding from a substrate; a gate electrode disposed over the semiconductor fin; a gate insulating layer disposed between the semiconductor fin and the gate electrode; source and drain regions disposed on opposite sides of the semiconductor fin; and a first stressor formed in a region of the substrate between the source and drain regions or in a region of the semiconductor fin between the source and drain regions. The first stressor is a grading strained stressor including multiple graded portions formed at graded depths, and the first stressor is configured to create one of a graded compressive stress or a graded tensile stress. In one or more of the foregoing or following embodiments, the first stressor comprises a nano-stressor, the first stressor includes one material selected from the group consisting of He, Ne, and Ga, and a lattice constant of the first stressor is greater than that of a region immedicably adjacent to the first stressor. In one or more of the foregoing or following embodiments, the first stressor is disposed under a central region of the semiconductor fin, and the first stressor is only stressor disposed between the source and drain regions, and the first stressor is configured to create the graded tensile stress. In one or more of the foregoing or following embodiments, the semiconductor device includes a second stressor, and the first and second stressors have similar structures and are disposed on opposite sides of the semiconductor fin and between the source and drain regions, and the first and second stressors are configured to create the graded compressive stress. In one or more of the foregoing or following embodiments, a material concentration in the first stressor is about $10^{10}/cm^3$ to about $10^{20}/cm^3$, and the graded depths are within a range of about 1 nm to 100 μm. In one or more of the foregoing or following embodiments, a material concentration in the first stressor is about $10^{15}/cm^3$ to about $10^{20}/cm^3$, and each portion of the multiple graded portions has a cross-sectional shape including one of a square, a rectangle, an oval, a triangle, or a hexagon. In one or more of the foregoing or following embodiments, the substrate is one selected from the group consisting of a Si substrate, a Ge substrate, a SiGe substrate, a GaAs substrate, and an InGaAs substrate.

In accordance with another aspect of the present disclosure, in a method for manufacturing a semiconductor device, a semiconductor fin is formed over a substrate. A graded sacrificial layer is deposited and patterned over the substrate. A first stressor is implanted in the substrate by using an ion beam through the graded sacrificial layer. The graded sacrificial layer is removed. A gate insulating layer is deposited and patterned to cover the semiconductor fin. A gate electrode layer is formed to cover the gate insulating layer. Source and drain electrodes are formed on opposite sides of the semiconductor fin. In one or more of the foregoing or following embodiments, the first stressor is formed of one material selected from the group consisting of He, Ne, and Ga implanted into the substrate. In one or more of the foregoing or following embodiments, the ion beam is a focused ion beam of one of He, Ne, or Ga, and the graded sacrificial layer comprises $SiO_x$ or $SiN_y$, and has thicknesses within a range of about 0.1 nm to 1000 nm. In one or more of the foregoing or following embodiments, forming the first stressor comprises forming a grading strained stressor including multiple graded portions at graded depths, and the graded depths follow a grading of the graded sacrificial layer. In one or more of the foregoing or following embodiments, a second stressor similar to the first stressor is formed on another side of the semiconductor fin opposite to the first stressor with respect to the semiconductor fin. The first stressor and the second stressor are implanted at different angles. In one or more of the foregoing or following embodiments, the grading strained stressor is capable of creating one of a graded compressive stress or a graded tensile stress, and the method further comprises performing an annealing process after forming the first stressor. In one or more of the foregoing or following embodiments, forming the first stressor comprises forming a grading strained stressor in a region under a central region of the semiconductor fin. In one or more of the foregoing or following embodiments, forming the first stressor comprises forming a grading strained stressor on one side of the semiconductor fin. Further, a second stressor similar to the first stressor is formed on another side of the semiconductor fin opposite to the first stressor with respect to the semiconductor fin. In one or more of the foregoing or following embodiments, the substrate is one selected from the group consisting of a Si substrate, a Ge substrate, a SiGe substrate, a GaAs substrate, and an InGaAs substrate. In one or more of the foregoing or following embodiments, a material concentration in the first stressor is about $10^{10}/cm^3$ to about $10^{20}/cm^3$.

In accordance with another aspect of the present disclosure, in a method for forming multiple nanowires on a semiconductor substrate, a patterned mask layer including multiple trenches is formed over the semiconductor substrate. A graded sacrificial layer is formed over the mask layer including the multiple trenches. Ion current is applied on a region of the graded sacrificial layer including the multiple openings, such that ions of the ion current bombard the region of graded sacrificial layer to settle at different depths in regions in the semiconductor substrate to form multiple stressors at the different depths. The multiple nanowires are grown on portions of the semiconductor substrate exposed by the multiple openings of the patterned mask layer. In one or more of the foregoing or following embodiments, the ions are one selected from the group consisting of He, Ne, and Ga, and the graded sacrificial layer comprises $SiO_x$ or $SiN_y$, and has thicknesses within a range of about 0.1 nm to 1000 nm. In one or more of the foregoing or following embodiments, the semiconductor substrate is a silicon substrate, the mask layer is a silicon oxide layer, and the nanowire is an InAs nanowire perpendicularly grown on the silicon substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor fin protruding from a substrate;
    a gate electrode disposed over the semiconductor fin;
    a gate insulating layer disposed between the semiconductor fin and the gate electrode;
    source and drain regions disposed on opposite sides of the semiconductor fin; and
    a first stressor formed in a region of the substrate between the source and drain regions or in a region of the semiconductor fin between the source and drain regions, wherein the first stressor has two or more portions at two or more different depths.

2. The semiconductor device of claim 1, wherein the first stressor includes one material selected from the group consisting of He, Ne, and Ga, and wherein a lattice constant of the first stressor is greater than that of a lattice constant of a region immediately adjacent to the first stressor.

3. The semiconductor device of claim 1, wherein:
    the first stressor is disposed under a central region of the semiconductor fin,
    the first stressor is only stressor disposed between the source and drain regions, and the first stressor is configured to create a graded tensile stress.

4. The semiconductor device of claim 1, wherein the first stressor is a graded strained stressor having multiple graded portions at graded depths.

5. The semiconductor device of claim 4, wherein the first stressor is configured to create one of a graded compressive stress or a graded tensile stress.

6. The semiconductor device of claim 1, wherein the first stressor is on one side of the semiconductor fin, the semiconductor device further comprising:
a second stressor similar to the first stressor on another side of the semiconductor fin opposite to the first stressor with respect to the semiconductor fin.

7. The semiconductor device of claim 6, wherein the first stressor and the second stressor are at different depths.

8. The semiconductor device of claim 4, wherein a material concentration in the first stressor is from about $10^{10}$ atoms/cm$^3$ to about $10^{20}$ atoms/cm$^3$, and wherein the graded depths are within a range of about 1 nm to 100 µm.

9. A semiconductor device, comprising:
a semiconductor fin protruding from a substrate;
a gate electrode disposed over the semiconductor fin;
a gate insulating layer disposed between the semiconductor fin and the gate electrode;
source and drain regions disposed on opposite sides of the semiconductor fin; and
a first stressor formed in a region of the substrate under the semiconductor fin, wherein the first stressor has two or more portions at two or more different depths.

10. The semiconductor device of claim 9, wherein the first stressor is a graded strained stressor having multiple graded portions at graded depths.

11. The semiconductor device of claim 9, wherein the first stressor is configured to create a graded tensile stress or a graded compressive stress to a channel.

12. The semiconductor device of claim 9, wherein the first stressor comprises helium.

13. The semiconductor device of claim 10, wherein a material concentration in the first stressor is from about $10^{15}$/cm$^3$ to about $10^{20}$/cm$^3$, and wherein each portion of the multiple graded portions has a cross-sectional shape including one of a square, a rectangle, an oval, a triangle, or a hexagon.

14. The semiconductor device of claim 9, wherein the first stressor is on one side of the semiconductor fin, the semiconductor device further comprising:
a second stressor similar to the first stressor on another side of the semiconductor fin opposite to the first stressor with respect to the semiconductor fin.

15. A semiconductor device, comprising:
a semiconductor fin protruding from a substrate;
a gate electrode disposed over the semiconductor fin;
a gate insulating layer disposed between the semiconductor fin and the gate electrode;
source and drain regions disposed on opposite sides of the semiconductor fin; and
a first stressor formed in regions of the substrate that are laterally adjacent to sides of the semiconductor fin, wherein the first stressor has two or more portions at two or more different depths.

16. The semiconductor device of claim 15, wherein the first stressor is a graded strained stressor having multiple graded portions at graded depths.

17. The semiconductor device of claim 15, wherein the first stressor is configured to create a graded compressive stress to a channel.

18. The semiconductor device of claim 15, wherein the first stressor comprises a material selected from the group consisting of He, Ne, and Ga.

19. The semiconductor device of claim 15, wherein the first stressor is configured to create a graded tensile stress to a channel.

20. The semiconductor device of claim 15, wherein the substrate is one selected from the group consisting of a Si substrate, a Ge substrate, a SiGe substrate, a GaAs substrate, and an InGaAs substrate.

* * * * *